(12) United States Patent
Soref et al.

(10) Patent No.: US 6,897,471 B1
(45) Date of Patent: *May 24, 2005

(54) STRAIN-ENGINEERED DIRECT-GAP GE/ $SN_XGE_{1-X}$ HETERODIODE AND MULTI-QUANTUM-WELL PHOTODETECTORS, LASER, EMITTERS AND MODULATORS GROWN ON $SN_YSI_ZGE_{1-Y-Z}$-BUFFERED SILICON

(75) Inventors: Richard A. Soref, Newton Centre, MA (US); Jose Menendez, Tempe, AZ (US); John Kouvetakis, Mesa, AZ (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/722,611

(22) Filed: Nov. 28, 2003

(51) Int. Cl.[7] .......................................... H01L 31/0328
(52) U.S. Cl. ............................ 257/22; 257/14; 257/15; 257/21
(58) Field of Search .......................... 257/14–15, 21–22

(56) References Cited

U.S. PATENT DOCUMENTS

| | | | | |
|---|---|---|---|---|
| 4,769,341 A | * | 9/1988 | Luryi | ........................ 117/105 |
| 5,523,592 A | * | 6/1996 | Nakagawa et al. | ........... 257/96 |
| 5,548,128 A | * | 8/1996 | Soref et al. | .................... 257/18 |
| 6,151,347 A | * | 11/2000 | Noel et al. | ..................... 372/45 |

* cited by examiner

Primary Examiner—Allan R. Wilson
(74) Attorney, Agent, or Firm—William G. Auton

(57) ABSTRACT

This invention teaches two new families of Si-based $Ge/Sn_xGe_{1-x}$ heterodiode and multiple quantum well (MQW) photonic devices: (1) band-to-band photodetectors, lasers, emitters, amplifiers and modulators for the 1.5 to 12 $\mu$m wavelength range; (2) intersubband photodetectors, lasers, emitters and modulators for 12 to 100 $\mu$m operation. The bipolar band-to-band devices have applications within the 1.5–2.2, 3–5 and 8-to-12 $\mu$m bands. The unipolar intersubband group has longwave infrared and terahertz applications. All strained-layer devices are grown a relaxed $Sn_ySi_zGe_{1-y-z}$ buffer layer—a virtual substrate (VS) grown directly upon a silicon wafer by unique LT UHV-CVD. The VS provides a low-defect atomic template for subsequent heteroepitaxy and is an essential enabling technique for engineering tensile and compressive strain within the $Ge/Sn_xGe_{1-x}$ MQW by selecting the VS lattice parameter to be approx midway between the layer lattices.

Figure 1:
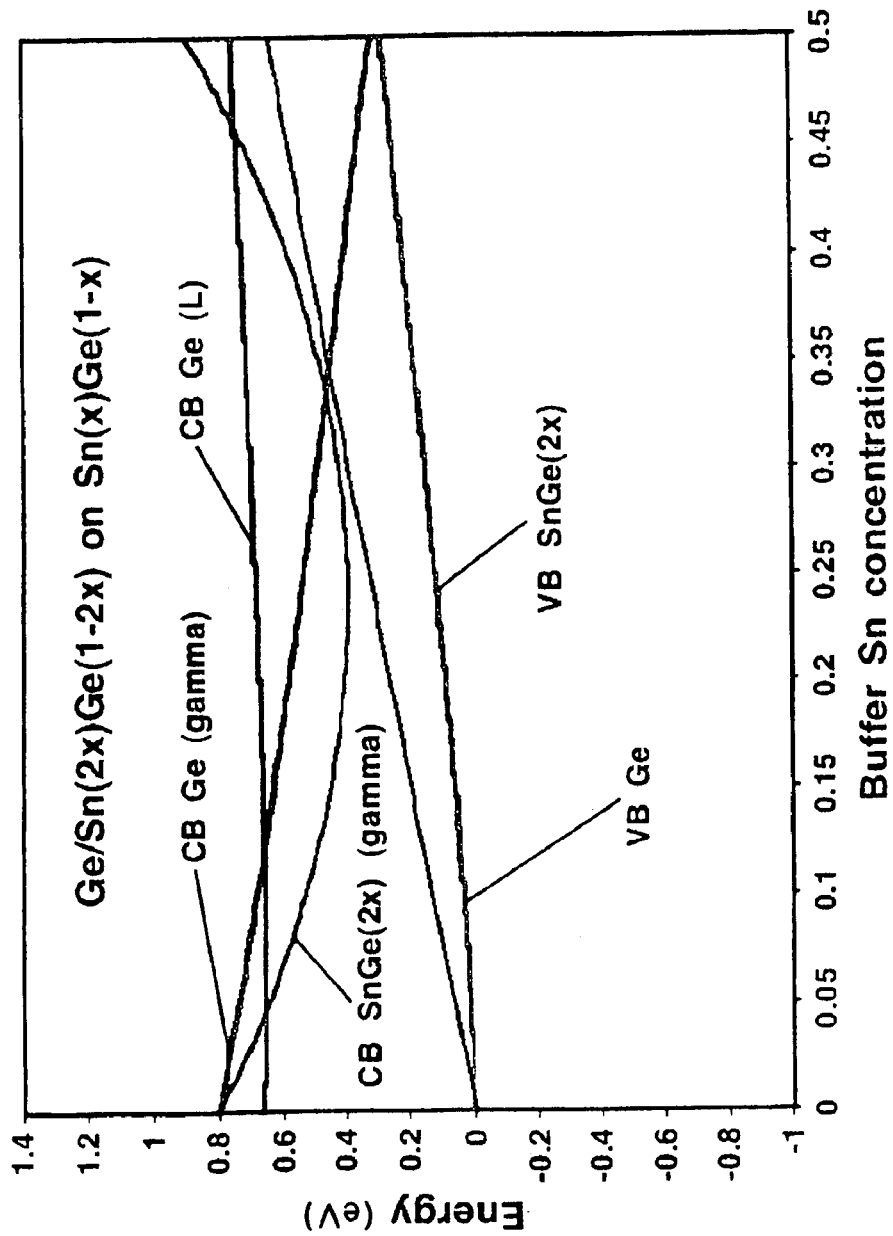

12 Claims, 8 Drawing Sheets

US 6,897,471 B1

STRAIN-ENGINEERED DIRECT-GAP GE/ SN$_X$GE$_{1-X}$ HETERODIODE AND MULTI-QUANTUM-WELL PHOTODETECTORS, LASER, EMITTERS AND MODULATORS GROWN ON SN$_Y$SI$_Z$GE$_{1-Y-Z}$-BUFFERED SILICON

STATEMENT OF GOVERNMENT INTEREST

The invention described herein may be manufactured and used by or for the Government for governmental purposes without the payment of any royalty thereon.

BACKGROUND OF INVENTION

This invention relates generally to the field of active, efficient, silicon-based photonic devices and photonic integrated circuits that are capable of monolithic integration with Si and SiGe electronics. The present invention does not include group III-V and II-VI photonic structures that are hybrid integrated onto silicon; instead, the present invention teaches an "all-group-IV" solution to the problem of active Si-based photonics in which the active strained-layer region consists of binary and/or ternary group IV alloy layers and/or Ge.

The Si-based photonic components and circuits in this invention are valuable for guided-wave and free-space applications. In the guided-wave case, the active devices taught here can merge with undoped silicon waveguides made from SOI and SOS, waveguides that transmit light over a very wide range of wavelengths because of silicon's transparency. This wavelength range begins at 1.2 μm and extends out to 100 μm. The 1.5–100 μm range is covered in this invention.

The prior art of active strained-layer Si-based photonics consists of SiGe/Si heterostructures and a few examples of GeSn alloy films grown upon a germanium substrate. The only prior-art patent we are aware of is the one by Soref and Friedman, U.S. Pat. No. 5,548,128, which describes Sn$_{1-x}$Ge$_x$Sn$_{1-y}$Ge$_y$ heterostructures. All the claims of that patent use SnxGe1-x as the quantum well active layers wherein the tin content is 5 to 15%, never zero. The claims in that patent do not include tensile-germanium layers within the active-layers-stack, that is, the barriers are GeSn, never Ge. This is a deficiency because elemental Ge is easy to deposit in a heteroepitaxial structure, and because recent research shows that an MQW having tensile Ge barriers and compressive GeSn wells in alternating layers with Type I band alignment is an excellent means for obtaining direct-gap wells. In addition, recent work shows that tensile Ge forms a useful quantum well upon a relaxed SiGeSn buffer of proper composition Regarding strain-compensated devices, the prior patent does not discuss strain balancing with Ge layers in the MQW. The prior patent deals with waveguided devices. Free-space devices, described here, are omitted from the prior patent, which is another deficiency because free-space devices such as normal-incidence photodetectors and surface-emitting lasers, are important. There is prior photonic art on Ill-V alloy structures hybrid-integrated on silicon, but this hybrid integration approach is deficient because the Si-to-III-V lattice mismatch creates difficulty and complexity in processing, tends to make the resulting structures costly and lower in quality. The present invention teaches stable, strain-engineered monolithic integration of group IV alloys on silicon.

SUMMARY OF INVENTION

The present invention overcomes the problems of Group IV indirect bandgap and limited MQW thickness. It is an object of this invention to specify a practical alloy system for silicon-based, strain-compensated, direct-gap, electrically controlled heterodiode and MQW photonic devices for a very wide range of operating wavelengths. In the most general case of this invention, the strained layers grown upon the VS are Sn$_x$Si$_p$Ge$_{1-x-p}$ alternating with Sn$_y$Si$_q$Ge$_{1-y-q}$. Intuitively, this is a practical heterosystem. However, the parameter-space of this ternary/ternary heterostructure grown upon the ternary buffer has not yet been mapped out, hence we shall focus here on a narrower case that is simple to fabricate, namely Ge alternating with Ge$_{1-x}$Sn$_x$. In most devices of practical interest, the VS is simply Ge$_{1-y}$Sn$_y$. The present invention deals primarily with this binary VS. Our theory shows that in a few MQW cases, a ternary alloy layer Sn$_x$Si$_p$Ge$_{1-x-p}$ will alternate with a Ge layer upon the binary VS.

DRAWINGS

FIG. 1. Calculated VB (HH) and CB(Γ and L) energies vs Sn concentration for strained multilayers Ge/Sn$_{2x}$Ge$_{1-2x}$ upon relaxed Sn$_x$Ge$_x$ FIG. 2. Calculated VB (HH) and CB(Γ and L) energies vs Sn concentration for strained Ge upon relaxed Sn$_x$Ge$_x$ FIG. 3. Calculated VB (HH) and CB(Γ and L) energies vs Sn concentration for strained Ge upon relaxed Sn$_x$Si$_q$Ge$_{1-x-q}$ FIG. 4. Band diagram (Γ—Γ) of biased, strain-balanced type-I MQW photodetector FIG. 5. Band diagram (Γ—Γ) of biased, strain-balanced type-I 5-layer photodetector FIG. 6. Band diagram (Γ—Γ) of biased, unbalanced type-II 4-layer photodetector FIG. 7. Band diagram (Γ—Γ) of biased, unbalanced type-I 4-layer photodetector FIG. 8. Photodetector for the 1.55 μm wavelength. This detector employs the FIG. 5 beterostructure.

DETAILED DESCRIPTED OF PREFERRED EMBODIMENTS

Figure 2:
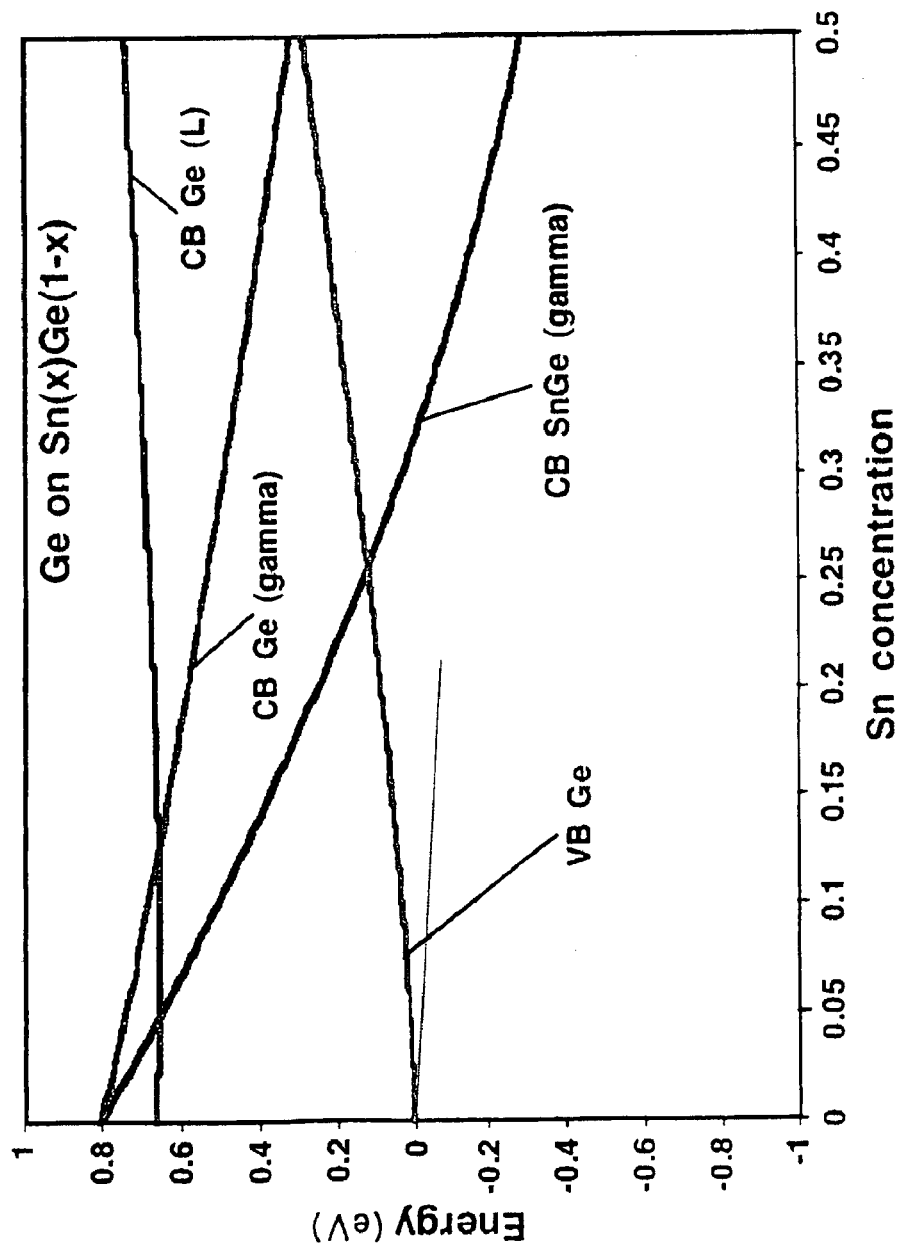
Figure 3:
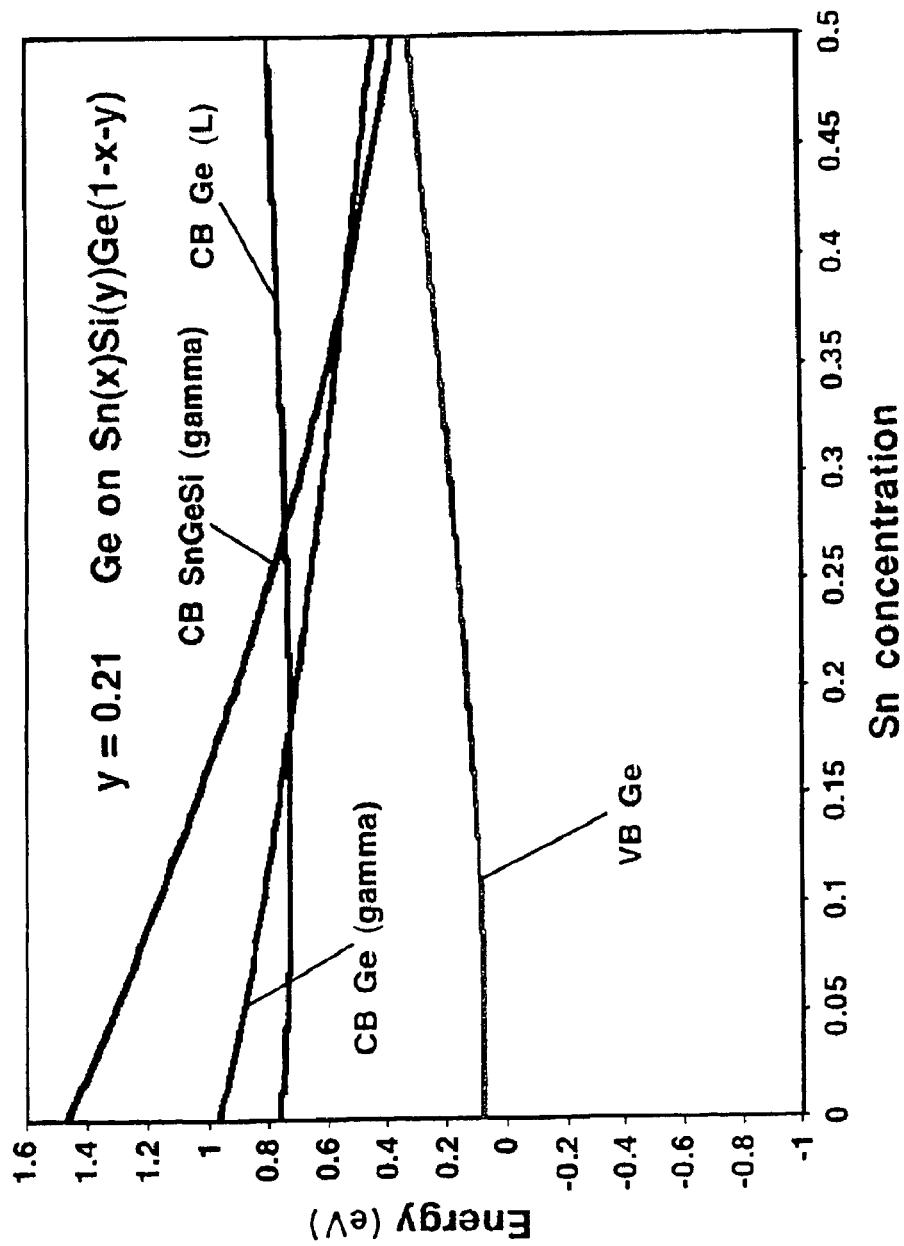

We describe interband embodiments first, then intersub-band devices. We have identified three strained-layer direct-gap structures that are useful for band-to-band photodetection as well as lasing, emission, amplification, and modulation in the near-infrared and middle-infrared regions: (A) strain-compensated Type I MQW of tensile-strained Ge barriers, compressively-strained Ge$_{1-2x}$Sn$_{2x}$ quantum wells, grown upon a relaxed buffer of Ge$_{1-x}$Sn$_x$ upon silicon, wherein electrons and holes are confined in Ge$_{1-2x}$Sn$_{2x}$; (B) an unsymmetrically strained Type-II system of tensile Ge and unstrained Ge$_{1-x}$Sn$_x$ grown on relaxed Ge$_{1-x}$Sn$_x$ upon silicon, with holes confined in Ge and electrons in Ge$_{1-x}$Sn$_x$; (C) an unsymmetrically strained Type-I system with tensile Ge wells, compressive Ge$_{1-x}$Sn$_x$ barriers, grown upon relaxed Si$_y$Sn$_x$Ge$_{1-x-y}$ upon silicon, with electrons and holes in Ge. FIGS. 1, 2, and 3 show the results of our first-principles band-offset calculations. Plotted in the figures are the highest valence band energy at Γ in k space and the lowest conduction-band energies (the Γ and L minima in k-space) for the well-barrier heterosystems A, B, and C described above.

Experimental work at Arizona State University shows the great progress that has been made on heterosystem C during 2003. The unique silicon-based SiGeSn/GeSn/Ge layer-fabrication process, which is described by Menedez, Kouvetakis and co-workers is described in two recent conference presentations and is the basis of this device patent (for added details, see M. B. Bauer, J. Kouvetakis, J. Menendez and R. A. Soref, "Growth of SnGe on Si for Strain-Balanced Ge/SnGe Quantum Well Heterostructures," presented the Third Int'l Conf. on SiGe© Epitaxy and Heterostructures, Santa Fe, N. Mex., Mar. 9–12, 2003, and M. Bauer, J. Taraci, J. Tolle, A. Chizmeshya, C. Hu, D. Smith, P. Crozier, J. Menendez, J. Kouvetakis, S. Zollner, "New Ge—Sn Semiconductors for Bandgap and Lattice Engineering," paper M2.5 presented at the Materials Research Conference, Boston, Mass., 2 Dec. 2002.) Single-phase $Si_{1-x-y}Ge_xSn_y$ alloys with random diamond cubic structures were created on Si (100) via ultrahigh vacuum chemical vapor deposition reactions of $SnD_4$ with $SiH_3GeH_3$ at 350° C. Commensurate heteroepitaxy is facilitated via formation of high compressibility $Ge_{1-x}Sn_x$ buffer layers on Silicon, which act as templates that can conform structurally and readily absorb the differential strain imposed by the more rigid Si and Si—Ge—Sn materials. The crystal structure, elemental distribution and morphological properties of the $Si_{1-x-y}Ge_xSn_y/Ge_{1-x}Sn_x$ heterostructures (such as $Si_{0.14}Ge_{0.80}Sn_{0.06}/Ge_{0.96}Sn_{0.04}$) are characterized by high-resolution electron microscopy including electron energy loss nanospectroscopy, x-ray diffraction (rocking curves) and atomic force microscopy. These techniques demonstrate growth of perfectly epitaxial, uniform and highly aligned layers with atomically smooth surfaces and monocrystalline structures that have lattice constants close to that of Ge. Rutherford backscattering ion channeling shows that the constituent elements occupy random substitutional sites in the same average diamond cubic lattice and the Raman shifts indicate Sn incorporation into Si—Ge tetrahedral sites. These heteroepitaxy results suggest that heterosystems A and B are feasible in practice, as well as C.

Figure 4:
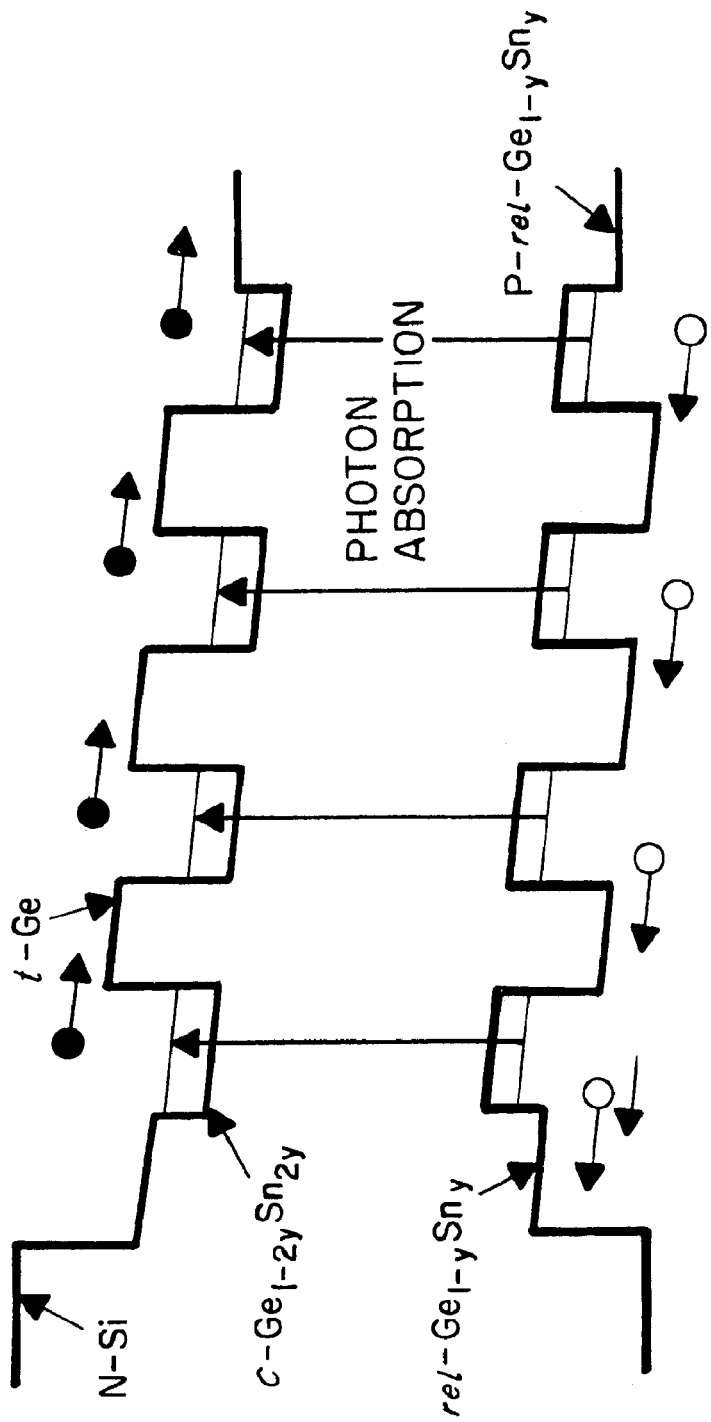
Figure 5:
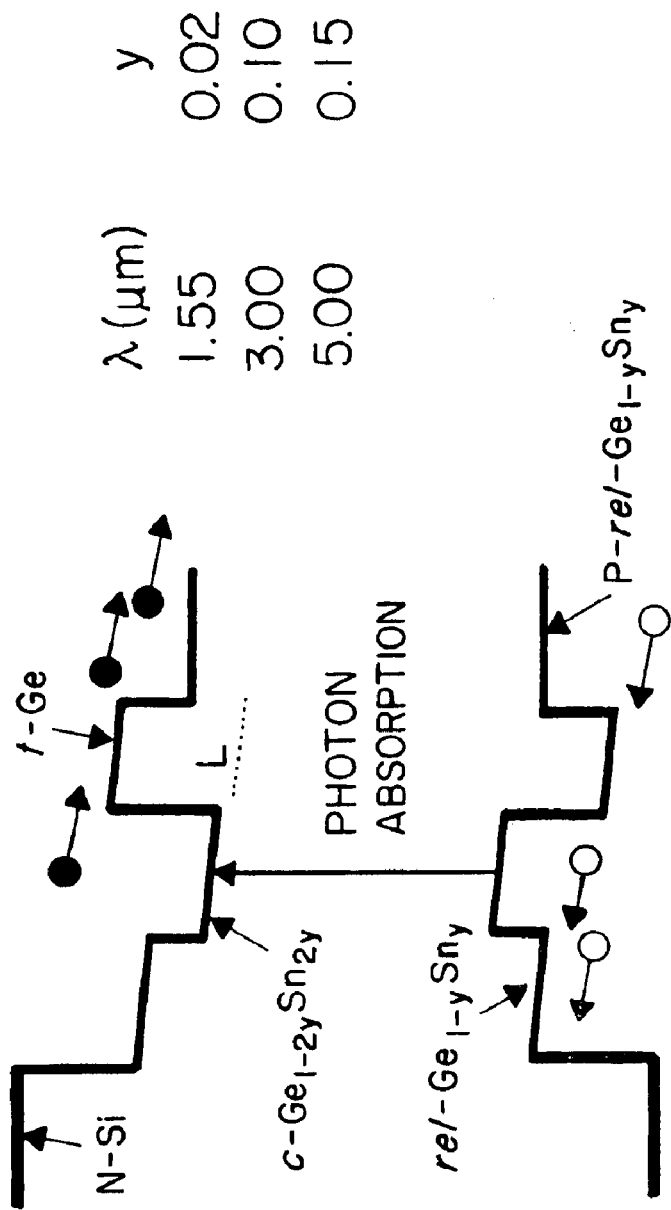
Figure 6:
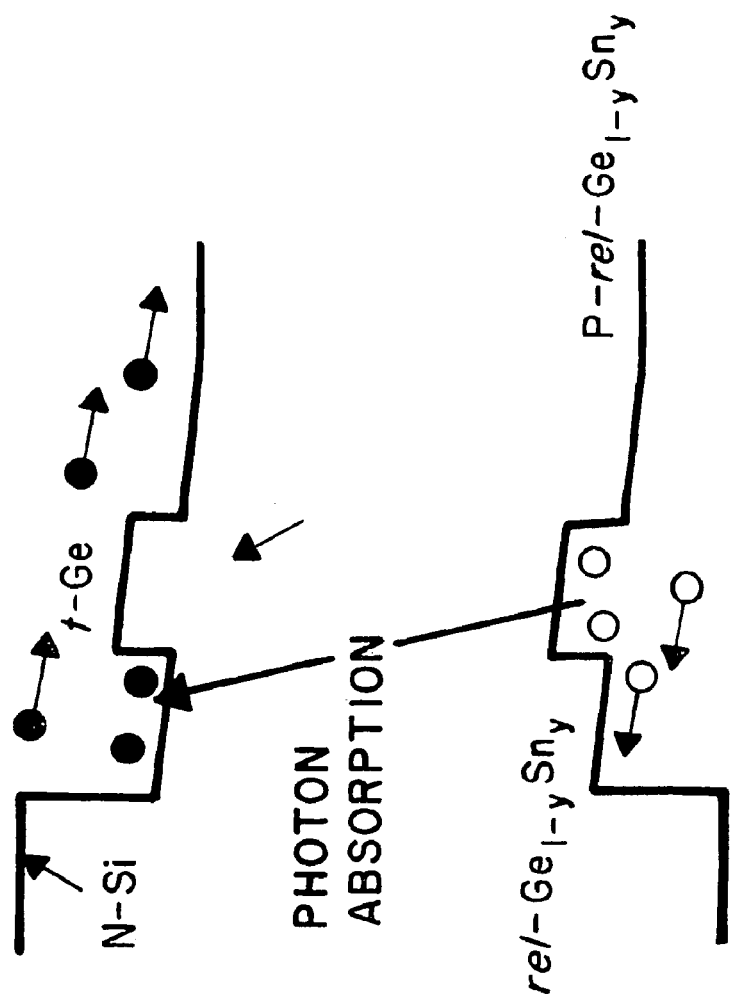
Figure 7:
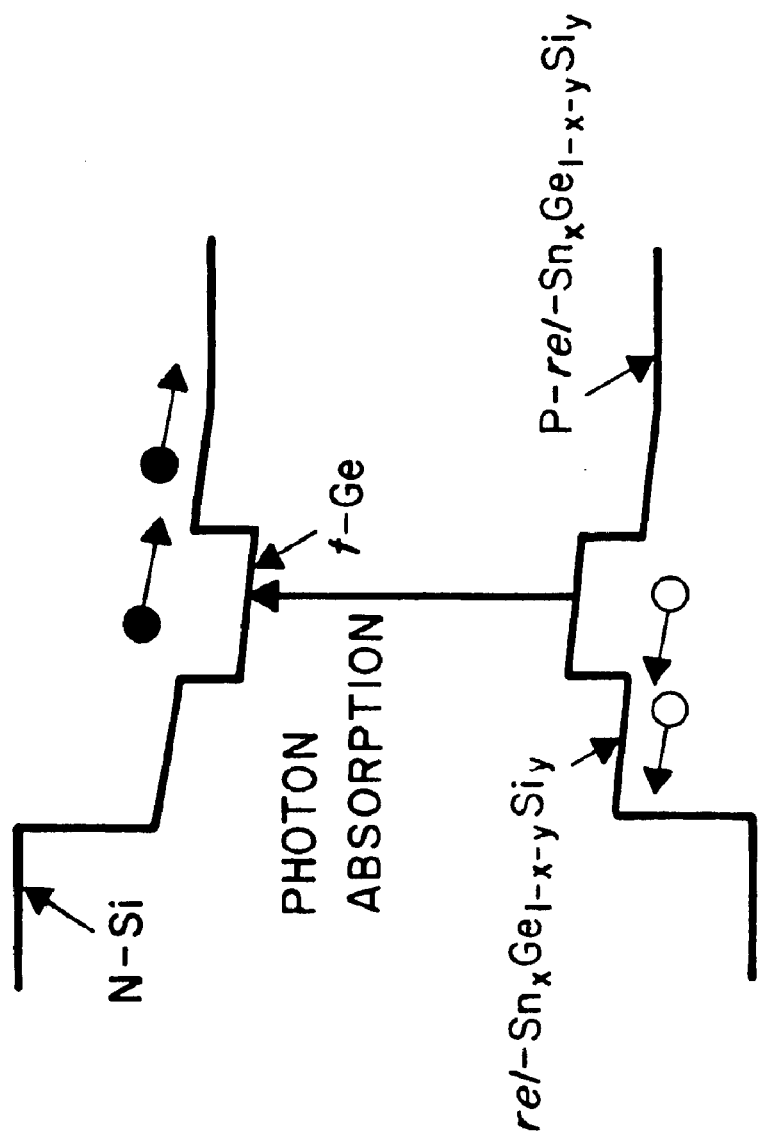
Figure 8:
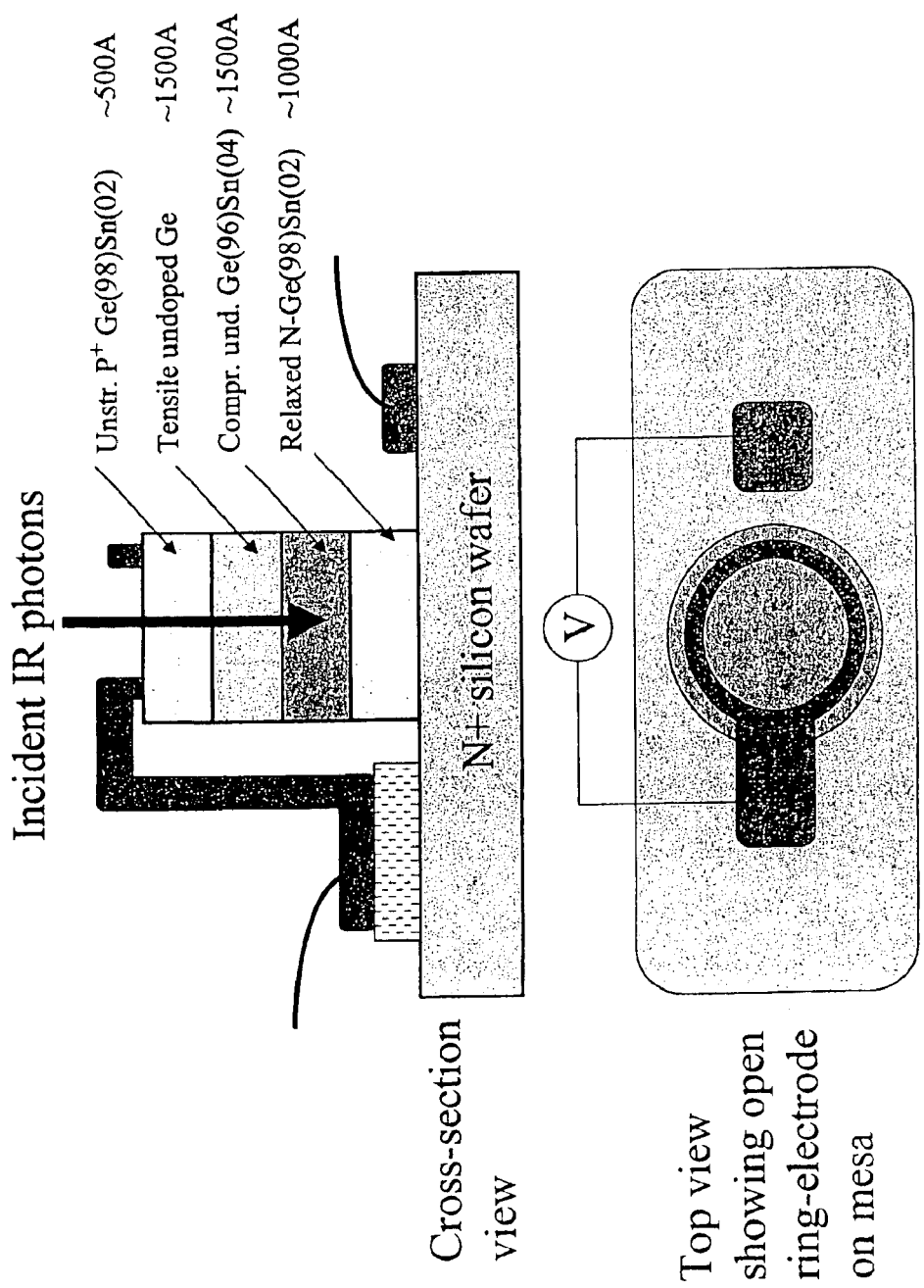

For heterostructure A, the PIN photodetector can be fabricated as the MQW device shown in FIG. 4 with a small external electric-field reverse bias applied to the diode, or as a simple 4-layer photodiode illustrated in FIG. 5. FIG. 4 depicts a CB subband and VB subband for cases where the QW thickness is less than 100 A. For heterosystems B and C, a simple 3-layer PIN photodiode is useful as depicted In FIGS. 6 and 7. The preferred embodiments are in the A system. The preferred heterostructure-A photodetectors are listed below for a maximum detection wavelength of 1.55 um (photon energy hv=800 meV), or of 3.00 $\mu$m (hv=413.3 meV) or of 5.00 $\mu$m (hv=248 meV), respectively First, in order to obtain strong photon absorption at E=hv, we take the direct bandgap EgI of the type-I GeSn well(s) to be 90% of the photon energy (EgI of 720 meV, 372 meV, and 223 meV, respectively). Then we find from modeling and simulation that the buffer is $Ge_{0.98}Sn_{0.02}$, $Ge_{0.90}Sn_{0.10}$, $Ge_{0.85}Sn_{0.15}$, respectively, and that the well composition is $Ge_{0.96}Sn_{0.04}$, $Ge_{0.80}Sn_{0.20}$, $Ge_{0.70}Sn_{0.30}$, respectively. If we plot $\lambda_{max}$ (the longest detection wavelength versus the tin content 2×(not shown here), we then see how this photosensor is continuously tunable by design. Such tunability applies to all the devices described in this patent. (For QWs less than 80 A thick, we could assume $E_gI$=hv).

The cases B and C are not preferred but have simplicity. In FIGS. 6–7 as well as in FIG. 5, the "well" width is typically 1000 A or more, hence quantum confinement is negligible in those three cases. For B, the buffer is $Ge_{0.98}Sn_{0.02}$ at the spatially indirect gap $E_gII$ 720 meV and $G_{0.86}Sn_{0.14}$ at EgII=372 meV. For C, at $E_gI$(Ge)=720 meV is not available physically and we must use instead the largest available direct gap EgI=580 meV (hv=644 meV), for which the buffer is $Sn_{0.20}Si_{0.21}Ge_{0.59}$. In addition to the PIN detectors illustrated in the above diagrams, it is easy to construct near- and mid-IR photodiodes in the form of metal-semiconductor-metal diodes, Schottky diodes and avalanche photodiodes. Previously, for 1.55 $\mu$m photosensing, the prior-art InGaAs APD has proven useful in the Geiger mode for low-level-light applications. The present invention suggests that the FIG. 5 device electrically biased into the avalanche regime could well perform a similar low-light sensing.

In FIGS. 4 and 5, there is a k-indirect GeVB(HH) to GeCB(L) photon absorption that exists simultaneously with the direct Γ—Γ absorption (L not shown in FIG. 4, although L is indicated in FIG. 5). However, this does not greatly affect device performance because the k-indirect absorption is comparatively weak As the Sn concentration in the GeSn QWs is increased, the energy of the Ge L-barrier moves up in energy and becomes higher than the Ge G-barrier energy (see FIG. 1). Thus we can say that as the direct gap of the GeSn QWs decreases (in the $\lambda_{max}$~3–5 $\mu$m devices), the HH to L absorption becomes quite negligible We have illustrated in FIG. 8 the mesa photodiode structure (normal incidence of IR photons from free space) using the FIG. 5 heterostructure optimized for the 1.55 $\mu$m telecomm wavelength. The mesa diameter could to 30 to 200 $\mu$m. In this heterostructure, the thickness of the $Ge_{1-2y}Sn_{2y}$ absorber is below the critical thickness for stable strain. We have not illustrated the infrared waveguided photodetector structures that are feasible in our new GeSn art, however, we can generally say that these detectors would be layered on top of a silicon or SiGe waveguide, or would be integrated at the end of the waveguide.

For near-IR and mid-IR band-to-band lasing, the strain-balanced MQW of system A is the preferred embodiment, and the laser band diagram looks much like that of FIG. 5, except that holes and electrons are both injected during forward bias of the PIN (rather than utilizing reverse bias) In this laser, photons are emitted across the gap rather than being absorbed. The photon emission selection rules, for appropriate crystallographic orientations of the Si substrate, will allow edge-emitting lasers as well as surface-emitting lasers. We have not illustrated the mirrored optical waveguide structure for the end-emitter, nor have we shown the VCSEL resonator mesa, but those structures are similar to those known in the prior art. The LED in this invention is the laser operated below its threshold. The amplifier structure and the electrooptic modulator structure would typically be an MQW etched intoridge waveguide with the direction of infrared propagation in the growth plane at 90 degrees to the growth axis. The photon energy used in the modulator would be slightly below the bandgap energy; "subgap radiation." Turning now to the preferred embodiments of the intersubband devices, there are three key structures; the quantum cascade laser, the quantum staircase laser, and the quantum well infrared photodetector (QWIP). The strain-balanced MQW heterosystem A, with Type I alignment and band diagram similar to FIG. 5, is preferred for all three device categories. The offset diagram of FIG. 1 indicates that the GeSn QWs will be generally shallow, hence the intersubband devices of this invention are optimum for longwave IR or far IR operation. Again, all devices are tunable by design via the choice of QW alloy composition and layer thicknesses. The laser resonators, the waveguided structures and mesa structures are similar to those in the intersubband device literature and are not shown here.

The intersubband lasers (not illustrated here) use either conduction subbands such as CB3, CB2, CB1 or valence subbands such as HH2, LH1 and HH1. These PIP or NIN GeSn/Ge cascade lasers use electrical injection of carriers and resonant tunneling of carriers between adjacent periods of the MQW. By contrast, the GeSn/Ge quantum well infrared photodetectors (QWIPs) do not employ resonant tunneling, and the QWs rather than being undoped, are doped N-type in an NIN sensor, or P-type in a PIP QWIP. The PIP device allows normal incidence sensing. The NIN uses end-fire input or grating assisted normal incidence sensing.

When FIGS. 1–3 are used for GeSn/Ge device design, parabolic conduction bands are obtained and this is novel for Group IV devices. By contrast, for example, in the SiGe system, the conduction bands have many valleys in k-space. In the intersubband case, the MQW stack thickness can be several microns as desired for the long wave IR operation because the stack is strain-symmetrized and stable. The GeSn intersubband devices are expected to be competitive with III-V intersubband devices, but GeSn advantageously has a silicon base useful for Si and SiGe optoelectronic integration. When operating devices in the far infrared, the deleterious effects of reststrahl bands and free carrier absorption are more "subdued" in the IV—IV materials than the absorptions found in the polar III-V materials.

What is claimed is:

1. A biopolar band-to-band infrared photodetector-diode, or laser diode, or light-emitting diode, or amplifier, or electrooptic modulator-diode comprising
   (a) a silicon substrate, wherein the substrate is doped N-type or P-type while the bapping layer is doped P-type or N-type to form an NIP or PIN diode,
   (b) a strain-relaxed $Ge_{1-y}Sn_y$ or $Ge_{1-y-z}Sn_ySi_z$ buffered layer upon Si, known as a virtual substrate, VS wherein the VS is $Ge_{1-y}Sn_y$ and the active region is a strain balanced type-I stack of compressive $Ge_{1-2y}Sn2_y$ quantum wells with tensile Ge barriers,
   (c) an active direct-bandgap region made up of a single-quantum-well heterostructure or a multi-quantum-well stack,
   (d) a strain-relieved capping layer of $Ge_{1-y}Sn_y$ or $Ge_{1-y-z}Sn_ySi_z$, matching the VS composition,
   (e) metallic electrical contacts to the Si substrate and capping layer.

2. Cap the devices of claim 1 wherein the composition y ranges from 0.02 to 0.15 for device operation at wavelengths ranging from 1.55 to 5.00 μm.

3. Cap the photodetector devices of claims 1 in which the substrate is doped N or P type and the cap layer contact is an Schotty barrier metal.

4. Cap the photodetector devices of claim 1 in which the substrate is undoped and an interleaved pair of metal electrodes is employed upon the cap layer.

5. The devices of claim 1 wherein the VS is $Ge_{1-y}Sn_y$ and the active region is an unsymmetrically strained type-II heterostructure with holes confined in a tensile Ge layer and electrons confined in the relaxed buffer layer.

6. The devices of claim 1 wherein the VS is $Ge_{1-y-z}Sn_ySi_z$ and the active region is an unsymmetrically strained type-I heterostructure with electrons-and-holes confined in a tensile Ge layer.

7. Cap the devices of claim 6 wherein y and z are approximately 0.2.

8. A unipolar intersubband long-wave-infrared photodetector-diode, or laser diode, or light emitting diode, or amplifier, or electrooptic modulator diode comprising:
   (a) silicon substrate,
   (b) strain-relaxed $Ge_{1-y}Sn_y$ buffer layer upon Si, known as a virtual substrate, VS,
   (c) an active direct-bandgap region made up of a strain-balanced type-I multi-quantum-well stack which has compressive $Ge_{1-2y}Sn_{2y}$ wells and tensile Ge barriers,
   (d) a strain-relieved capping layer of $Ge_{1-y}Sn_y$ that matches the VS composition,
   (f) metallic electrical contacts to the Si substrate and/or capping layer.

9. Cap the photodetector devices of claim 8 wherein the VS and cap and quantum wells are doped N type.

10. Cap the photodector devices of claim 8 wherein the VS and cap and quantum wells are doped P type.

11. Cap the laser, emitter, amplifier and modulator devices of claim 8 wherein the VS and cap are both doped P-type for electron injection or for hole injection, respectively.

12. Cap the laser, emitter, amplifier and modulator devices of claim 8 wherein the resonant tunneling of injected carriers is used between adjacent periods of the active region in the manner of a quantum cascade.

* * * * *